(12) United States Patent
Takamine (10) Patent No.: US 6,756,867 B2
(45) Date of Patent: Jun. 29, 2004

(54) SURFACE ACOUSTIC WAVE FILTER AND COMMUNICATION APPARATUS

(75) Inventor: Yuichi Takamine, Kanazawa (JP)

(73) Assignee: Murata Manufacturing Co., LTD, Kyoto (JP)

( * ) Notice: Subject to any disclaimer, the term of this patent is extended or adjusted under 35 U.S.C. 154(b) by 34 days.

(21) Appl. No.: 10/215,024

(22) Filed: Aug. 9, 2002

(65) Prior Publication Data

US 2003/0030512 A1 Feb. 13, 2003

(30) Foreign Application Priority Data

Aug. 9, 2001 (JP) .................................. 2001-242846
May 31, 2002 (JP) .................................. 2002-159137

(51) Int. Cl.[7] .............................. H03H 9/00; H02N 1/04
(52) U.S. Cl. ................................. 333/193; 310/313 B
(58) Field of Search ............................... 333/193, 195, 333/133; 310/313 R, 313 B, 311; 340/10.1

(56) References Cited

U.S. PATENT DOCUMENTS

| | | | | |
|---|---|---|---|---|
| 5,585,684 A | * | 12/1996 | Abe ........................ | 310/313 A |
| 5,666,091 A | * | 9/1997 | Hikita et al. ................ | 333/193 |
| 5,990,762 A | * | 11/1999 | Nakamura et al. .......... | 333/195 |
| 6,078,229 A | * | 6/2000 | Funada et al. .............. | 333/193 |
| 6,297,712 B1 | * | 10/2001 | Kadota et al. .............. | 333/133 |
| 6,552,631 B2 | * | 4/2003 | Huor .......................... | 333/195 |

FOREIGN PATENT DOCUMENTS

| | | |
|---|---|---|
| EP | 1251638 | * 10/2002 |
| JP | 10-163803 | 6/1998 |
| TW | 345749 | 11/1998 |

* cited by examiner

Primary Examiner—Patrick Wamsley
(74) Attorney, Agent, or Firm—Keating & Bennett, LLP (57) ABSTRACT

A surface acoustic wave filter unit includes three interdigital transducers arranged along the surface acoustic wave propagation direction on a piezoelectric substrate so as to provide a balance-to-unbalance conversion function. Balanced signal terminals are connected to a pair of electrode finger sets of the center interdigital transducer. An unbalanced signal terminal is connected to one electrode finger set of each of the end interdigital transducers. The other electrode finger set of each of the end interdigital transducers is connected to a ground terminal. The ground terminals connected to the end interdigital transducers are electrically isolated from each other on the piezoelectric substrate.

20 Claims, 10 Drawing Sheets

SURFACE ACOUSTIC WAVE FILTER AND COMMUNICATION APPARATUS

BACKGROUND OF THE INVENTION

1. Field of the Invention

The present invention relates to a surface acoustic wave filter having filtering characteristics and a balance-to-unbalance conversion function, and to a communication apparatus including such a surface acoustic wave filter.

2. Description of the Related Art

Recently, there has been significant technological progress in reducing the size and weight of cellular telephones. In order to achieve these results, in addition to reducing the number and size of components, multi-function components are being increasingly developed. In view of such a background, recent research has been actively conducted on surface acoustic wave (SAW) filters having a balance-to-unbalance conversion function, i.e., a so-called "balun" function, which filters are used in the RF (radio frequency) stage of cellular telephones. Such SAW filters are used mostly for GSM (global system for mobile communications) compliant devices.

If a balanced line such as a twin lead feeder is directly coupled to an unbalanced line such as a coaxial cable, an unbalanced current flows, thereby, undesirably causing the feeder itself to operate as an antenna. A circuit called a balun is thus required for preventing the unbalanced current in order to match the balanced line to the unbalanced line.

Figure 11:
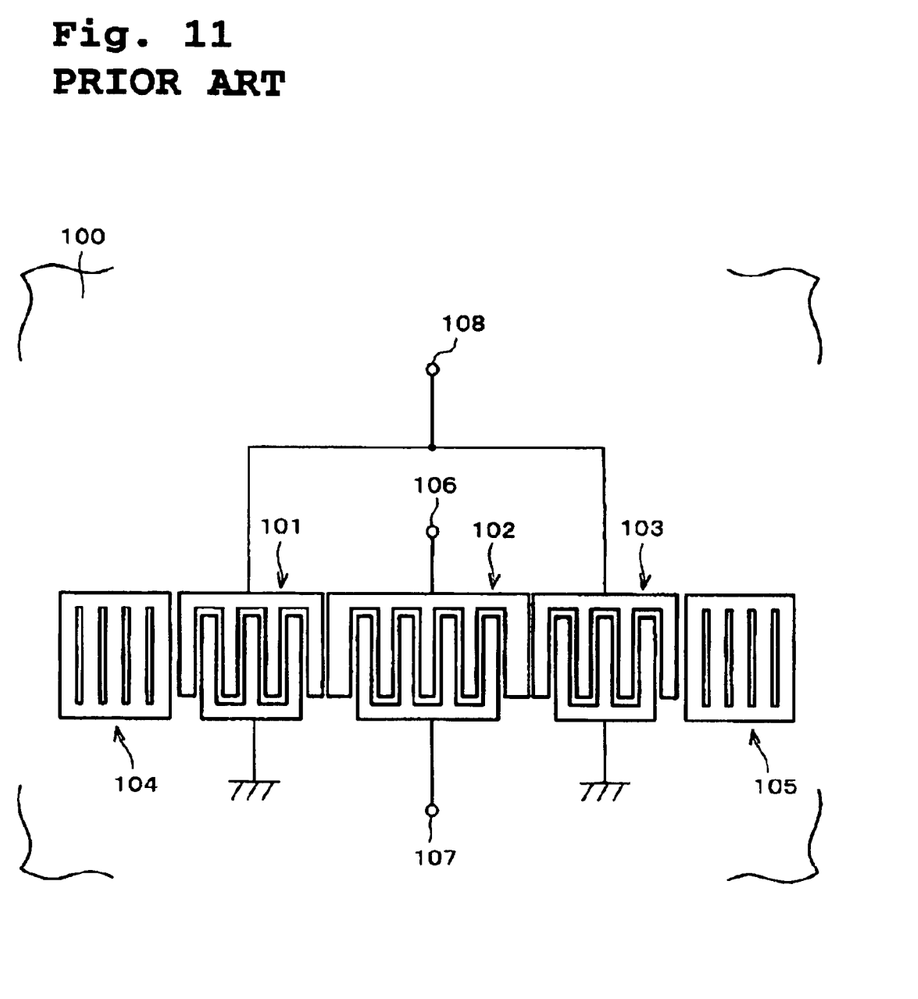
FIG. 11 is a schematic diagram of a SAW filter in the related art having a balance-to-unbalance conversion function.

Many patent applications pertaining to SAW filters having a balance-to-unbalance conversion function have been filed. A well-known SAW filter having a balance-to-unbalance conversion function and an input impedance and output impedance which are substantially equal is illustrated in FIG. 11.

In the SAW filter shown in FIG. 11, a comb-like electrode (also called an interdigital transducer, hereinafter referred to as an "IDT") 102 is disposed on a piezoelectric substrate 100. IDTs 101 and 103 are positioned on the left and right sides of the IDT 102, respectively, in the surface acoustic wave (SAW) propagation direction.

Reflectors 104 and 105 for reflecting a surface acoustic wave in order to improve the conversion efficiency are further arranged in the SAW filter in such a manner that they sandwich the IDTs 101, 102, and 103 therebetween from the left and right. Balanced signal terminals 106 and 107 are connected to sets of electrode fingers of the center IDT 102, respectively. An unbalanced signal terminal 108 is connected to one set of electrode fingers of each of the IDTs 101 and 103.

The SAW filter of this type is called a three-IDT longitudinally coupled resonator SAW filter having a balance-to-unbalance conversion function by performing conversion between the IDTs 101, 102, and 103 using a surface acoustic wave.

In a SAW filter having a balance-to-unbalance conversion function, it is required that the transmission characteristics in the pass band between the unbalanced signal terminal 108 and each of the balanced signal terminals 106 and 107 have equal amplitude characteristics and 180°-out-of-phase characteristics.

The characteristic of the balanced signal terminals 106 and 107 having equal amplitude characteristics and the characteristic of the balanced signal terminals 106 and 107 being 180° out of phase are referred to as "amplitude balance" and "phase balance", respectively.

The amplitude balance and the phase balance are defined as follows. If the SAW filter having a balance-to-unbalance conversion function is a three-port device consisting of, for example, a first port corresponding to an unbalanced input terminal and second and third ports corresponding to balanced output terminals, the amplitude balance=[A], where A=|20log(S21)|−|20log(S31)|, and the phase balance=B−180, where B=|∠S21−∠S31|. In the above equations, S21 denotes the transfer coefficient from the first port to the second port, S31 denotes the transfer coefficient from the first port to the third port, and || indicates an absolute value.

In balance between balanced signal terminals, ideally, the amplitude balance and the phase balance, as defined above, are 0 dB and 0 degree, respectively, in the pass band of a SAW filter.

However, the SAW filter in the related art shown in FIG. 11 has a problem in that balance between the balanced signal terminals 106 and 107 is reduced.

SUMMARY OF THE INVENTION

In order to overcome the problems described above, preferred embodiments of the present invention provide a surface acoustic wave filter having a balance-to-unbalance conversion function and having high balance between balanced signal terminals, and also provide a communication apparatus including such a novel SAW filter which achieves excellent high transmission characteristics.

According to a preferred embodiment of the present invention, a SAW filter includes a piezoelectric substrate, a filter unit provided on the piezoelectric substrate and having an odd number of at least three IDTs arranged along a SAW propagation direction, each IDT having a pair of electrode finger sets. Balanced signal terminals are connected to the pair of electrode finger sets of the center IDT in the IDTs, and an unbalanced signal terminal is connected to one electrode finger set of each of at least two end IDTs of the IDTs. The end IDTs are different from the center IDT, and are located on ends of the filter unit. The other electrode finger set of each of the at least two end IDTs is connected to a ground. The ground for at least one of the at least two end IDTs is electrically isolated on the piezoelectric substrate from the ground for the other end IDT.

With this configuration, the balanced signal terminals are connected to the pair of electrode finger sets of the center IDT positioned at the center of the IDTs, and the unbalanced signal terminal is connected to one electrode finger set of each of at least two end IDTs that is different from the center IDT of the IDTs, thereby implementing a balance-to-unbalance conversion function. Furthermore, the ground for at least one end IDT of the end IDTs is electrically isolated on the piezoelectric substrate from the ground for the other end IDT, thereby making it possible to improve balance between the balanced signal terminals.

In the SAW filter, a signal line which connects the unbalanced signal terminal to the end IDTs may be arranged so as to surround one of the balanced signal terminals, and a ground line may be provided between the signal line and the balanced signal terminal surrounded by the signal line. This allows the bridge capacitance inserted between the signal line and the balanced signal terminal to be reduced by the ground line, thereby making it possible to improve balance between the balanced signal terminals.

According to another preferred embodiment of the present invention, a SAW filter includes a piezoelectric substrate, a plurality of filter units provided on the piezoelectric substrate, each unit having an odd number of at least three IDTs along a SAW propagation direction, and each IDT having a pair of electrode finger sets. Balanced signal terminals are connected to the pair of electrode finger sets of a first center IDT which is located at the center of a first filter unit of the plurality of filter units, and an unbalanced signal terminal is connected to one electrode finger set of a second center IDT which is located at the center of a second filter unit, which is different from the first filter unit of the plurality of filter units. One electrode finger set of each of the end IDTs which are different from the first and second center IDTs of the plurality of filter units is connected to a ground, and the end interdigital transducers are located on ends of the first and second filter units. The ground for at least one of the end IDTs is electrically isolated on the piezoelectric substrate from the ground for the other end IDT.

With this unique configuration, the plurality of filter units increase the out-of-passband attenuation, and improve filtering characteristics. Furthermore, the balanced signal terminals are connected to the pair of electrode finger sets of the first center IDT, and the unbalanced signal terminal is connected to one electrode finger set of the second center IDT, thereby implementing a balance-to-unbalance conversion function. Moreover, the ground for at least one end IDT of the end IDTs is electrically isolated on the piezoelectric substrate from the ground for the other end IDT, thereby improving balance between the balanced signal terminals.

In the SAW filter, a package which receives the piezoelectric substrate may include a plurality of separate bonding pads for ground terminals. Preferably, the grounds for the end IDTs that sandwich the center IDT therebetween are connected to the different bonding pads so as to be electrically isolated from each other. With this configuration, the grounds for the end IDTs are separated on the package, thereby making it possible to further improve balance between the balanced signal terminals.

In the SAW filter, preferably, the IDT connected to the balanced signal terminals has an even number of electrode fingers in total. This enables the number of electrode fingers connected to one balanced signal terminal to be equal to the number of electrode fingers connected to the other balanced signal terminals, thereby further improving balance between the balanced signal terminals.

In the SAW filter, preferably, at least one SAW resonator is connected at least in series or in parallel to the filter unit. This configuration increases the out-of-passband attenuation, and can improve filtering characteristics.

In still another preferred embodiment of the present invention, a communication apparatus includes the SAW filter according to any of the above-described configurations of the various preferred embodiments of the present invention. With use of the SAW filter which can implement a balance-to-unbalance conversion function and which has improved balance, the communication apparatus can improve transmission characteristics.

Other elements, features, characteristics and advantages of the present invention will become more apparent from the following detailed description of preferred embodiments thereof with reference to the attached drawings.

DETAILED DESCRIPTION OF PREFERRED EMBODIMENTS

A SAW filter according to a preferred embodiment of the present invention is now described with reference to FIGS. 1 to 10. In the following description, preferred embodiments of the present invention are described in the context of a PCS (personal communication system) reception filter but the present invention is not limited thereto.

Figure 1:
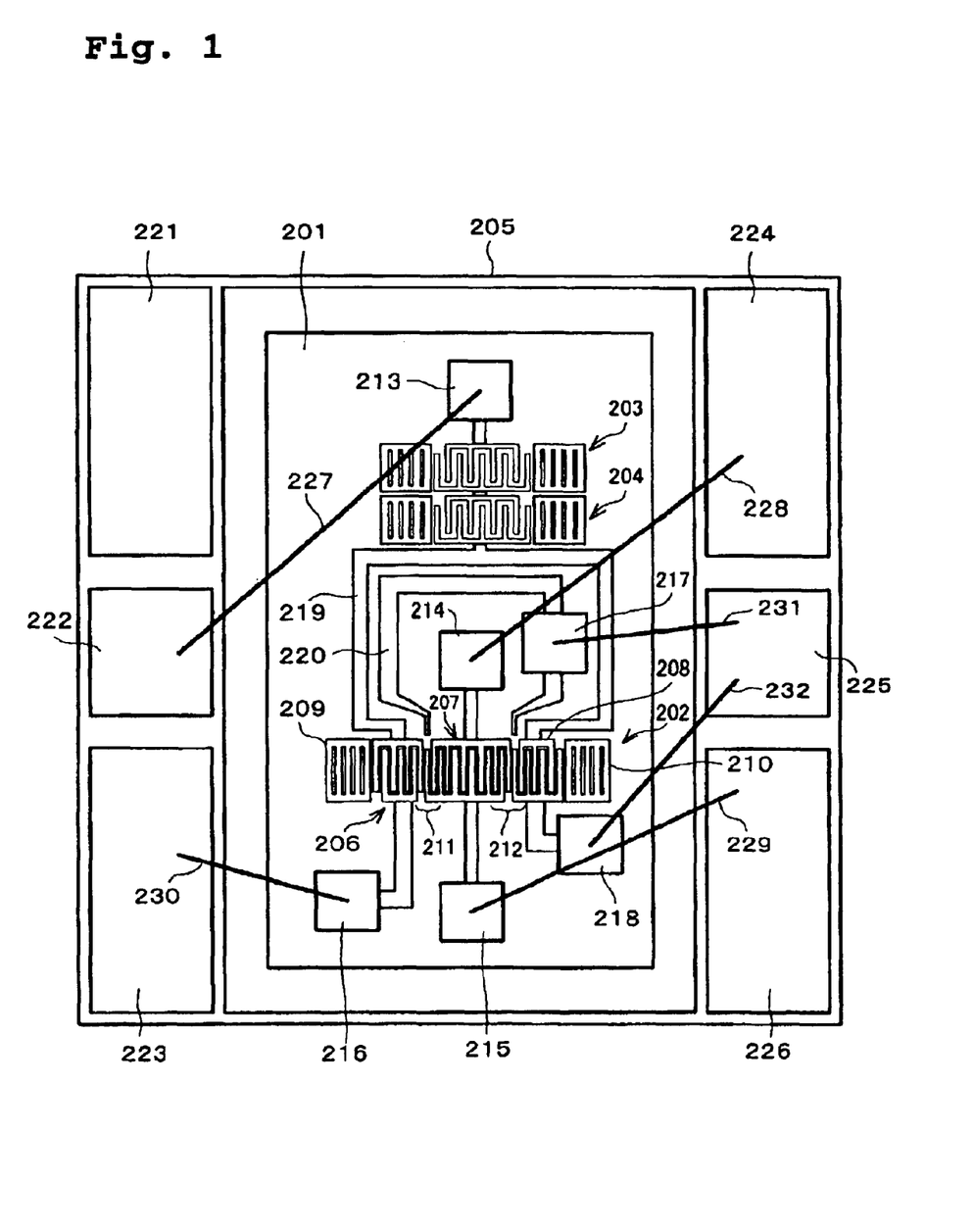
FIG. 1 is a schematic diagram of a SAW filter according to a preferred embodiment of the present invention.

In a SAW filter according to a preferred embodiment of the present invention, as shown in FIG. 1, on a piezoelectric substrate 201, a longitudinally coupled resonator SAW filter unit 202, and SAW resonators 203 and 204 connected in series to the SAW filter unit 202 preferably are each made of an aluminum (Al) electrode (foil) produced by a technique such as photolithography. In this preferred embodiment, the piezoelectric substrate 201 may be a 40±5° Y-cut X-propagating $LiTaO_3$ substrate, however, other suitable substrates may be used.

The SAW filter further includes a package 205 which includes, on the inner surface thereof, the piezoelectric substrate 201 carrying the SAW filter unit 202 and other elements. The package 205 is preferably a substantially rectangular insulator plate made of alumina or other suitable material. Around the periphery of the inner surface of the package 205, substantially rectangular thin metallic bonding pads 221, 223, and 225 for defining ground terminals are disposed on the inner surface of the package 205 that is the same as the surface on which the piezoelectric substrate 201 rests. The bonding pads 221, 223, and 225 are adjacent to the piezoelectric substrate 201.

A substantially rectangular thin metallic bonding pad 222 for an unbalanced signal input is also disposed on this inner surface of the package 205 between the bonding pads 221 and 223 along the periphery of the inner surface. On the inner surface of the package 205, substantially rectangular thin metallic bonding pads 224 and 226 for defining outputs of balanced signal terminals are also arranged in such a manner that they sandwich the bonding pad 225 therebetween.

The SAW filter unit 202 includes a center IDT 207, and end IDTs 206 and 208, which sandwich the IDT 207 therebetween from both sides in the SAW propagation direction. The SAW filter unit 202 further includes reflectors 209 and 210 positioned beside the IDTs 206 and 208, respectively.

The IDTs 206, 207, and 208 each have two electrode finger portions each including a strip base portion (bus bar)

and a plurality of strip electrode fingers extending substantially parallel to each other and extending substantially perpendicularly from one side of the base portion. The electrode finger portions are arranged so that the electrode fingers of one electrode finger portion are interleaved with the electrode fingers of the other electrode finger portion such that the sides thereof face each other.

In any of the IDTs 206, 207, and 208, if a potential difference occurs due to electrical signals input to the two electrode finger portions via the base portions (bus bars), a surface acoustic wave is produced at that portion on a surface of the piezoelectric substrate 201. The surface acoustic wave then propagates across the surface of the piezoelectric substrate 201 in a bi-directional manner in the width direction of the electrode fingers, i.e., in the direction that is substantially perpendicular to the length of the electrode fingers. In an IDT to which no electrical signal is input, the potential difference produced on the surface of the piezoelectric substrate 201 by the propagating surface acoustic wave is detected by the electrode fingers, and is converted into an output electrical signal, which is then output.

In the IDTs 206, 207, and 208, the signal conversion characteristic or the pass band can be determined by setting the length and width of each electrode finger, the pitch between adjacent electrode fingers, and the interdigital length which means the length by which the interleaved electrode fingers face each other. The reflectors 209 and 210 reflect the propagating surface acoustic wave.

As is apparent from FIG. 1, in the SAW filter unit 202, the pitch between some electrode fingers (narrower-pitch electrode fingers) near the portion (indicated by a portion 211) where the IDTs 206 and 207 face each other is smaller than the pitch between the other electrode fingers of the IDTs 206 and 207. Likewise, the pitch between some electrode fingers (narrower-pitch electrode fingers) near the portion (indicated by a portion 212) where the IDTs 207 and 208 face each other is narrower than the pitch between the other electrode fingers of the IDTs 207 and 208. The narrower-pitch electrode fingers allow the insertion loss to be reduced. For simplicity of illustration, the number of electrode fingers shown in FIG. 1 is less than actually provided.

On the piezoelectric substrate 201, balanced signal terminals 214 and 215 are connected to the electrode finger portions of the IDT 207. On the piezoelectric substrate 201, an unbalanced signal terminal 213 is electrically connected to one electrode finger portion in each of the IDTs 206 and 208 through the SAW resonators 203 and 204 via a signal line 219. The signal line 219 is substantially C-shaped so as to surround the balanced signal terminal 214.

A substantially C-shaped ground line 220 is inserted on the piezoelectric substrate 201 so as to isolate the signal line 219 and the balanced signal terminal 214 from each other. The ground line 220 allows the bridge capacitance between the signal line 219 and the balanced signal terminal 214 to be reduced, thereby improving balance between the balanced signal terminals 214 and 215.

The signal line 219 and the ground line 220 preferably are each made of an aluminum (Al) electrode (foil) produced by a technique such as photolithography.

Thin metallic ground terminals 216, 217, and 218, which are preferably made of Al or other suitable material using a technique such as photolithography, are preferably separately formed on the piezoelectric substrate 201. The ground terminal 216 is electrically connected to the other electrode finger portion of the IDT 206. The ground terminal 217 is located on the ground line 220, and is electrically connected to the ground line 220. The ground terminal 218 is electrically connected to the other electrode finger portion of the IDT 208.

One of the unique features of the present preferred embodiment is that the ground terminal 216 for the IDT 206 is electrically isolated from the ground terminal 218 for the IDT 208 on the piezoelectric substrate 201.

The SAW filter unit 202 disposed on the piezoelectric substrate 201 is electrically connected to the package 205 preferably by a wire bonding method. The unbalanced signal terminal 213 is electrically connected to the bonding pad 222 of the package 205 via a bonding wire 227. The balanced signal terminal 214 is electrically connected to the bonding pad 224 via a bonding wire 228. The balanced signal terminal 215 is electrically connected to the bonding pad 226 via a bonding wire 229.

The ground terminal 216 is electrically connected to the bonding pad 223 via a bonding wire 230. The ground terminals 217 and 218 are electrically connected to the bonding pad 225 via bonding wires 231 and 232, respectively.

Another unique feature of the present preferred embodiment is that the ground terminals 216 and 218 are electrically connected to the different bonding pads 223 and 225, respectively, while the bonding pads 223 and 225 are electrically isolated from each other in the package 205.

Next, a specific example of the present preferred embodiment of the present invention will be described. If the wavelength defined by the pitch between the narrower-pitch electrode fingers is indicated by $\lambda I_2$ (indicated by the portions 211 and 212 in FIG. 1), and the wavelength defined by the pitch between the other electrode fingers is indicated by $\lambda I_1$, the specific design of the longitudinally coupled resonator SAW filter unit 202 is as follows:

interdigital length W: 53.7 $\lambda I_1$;
number of electrode fingers of the IDT 206: 29(4)
number of electrode fingers of the IDT 207: (4)44(4)
number of electrode fingers of the IDT 208: (4)29
(the number in parentheses indicates the number of narrower-pitch electrode fingers);
IDT wavelength $\lambda I_1$: 2.05 $\mu$m
$\lambda I_2$: 1.86 $\mu$m;
reflector wavelength $\lambda R$: 2.06 $\mu$m;
number of electrode fingers of reflector: 100;
center-to-center distance between electrode fingers of IDTs: 0.50 $\lambda I_2$;
center-to-center distance between electrode fingers of IDT and reflector: 0.47 $\lambda R$;
duty: 0.60 (for IDT and reflector); and
electrode thickness: 0.080 $\lambda I_1$.

The specific design of the SAW resonator 203 is as follows:

interdigital length W: 49.1 $\lambda$;
number of electrode fingers of IDT: 401;
wavelength $\lambda$ (for IDT and reflector): 2.04 $\mu$m;
number of electrode fingers of reflector: 30;
pitch between IDT and reflector: 0.50 $\lambda$;
duty: 0.60 (for IDT and reflector); and
electrode thickness: 0.080 $\lambda$.

The specific design of the SAW resonator 204 is as follows:

interdigital length W: 40.6 $\lambda$;
number of electrode fingers of IDT: 241;
wavelength $\lambda$ (for IDT and reflector): 1.97 $\mu$m;
number of electrode fingers of reflector: 30;
pitch between IDT and reflector: 0.50 $\lambda$;

duty: 0.60 (for IDT and reflector); and
electrode thickness: 0.084 λ.

Figure 2:
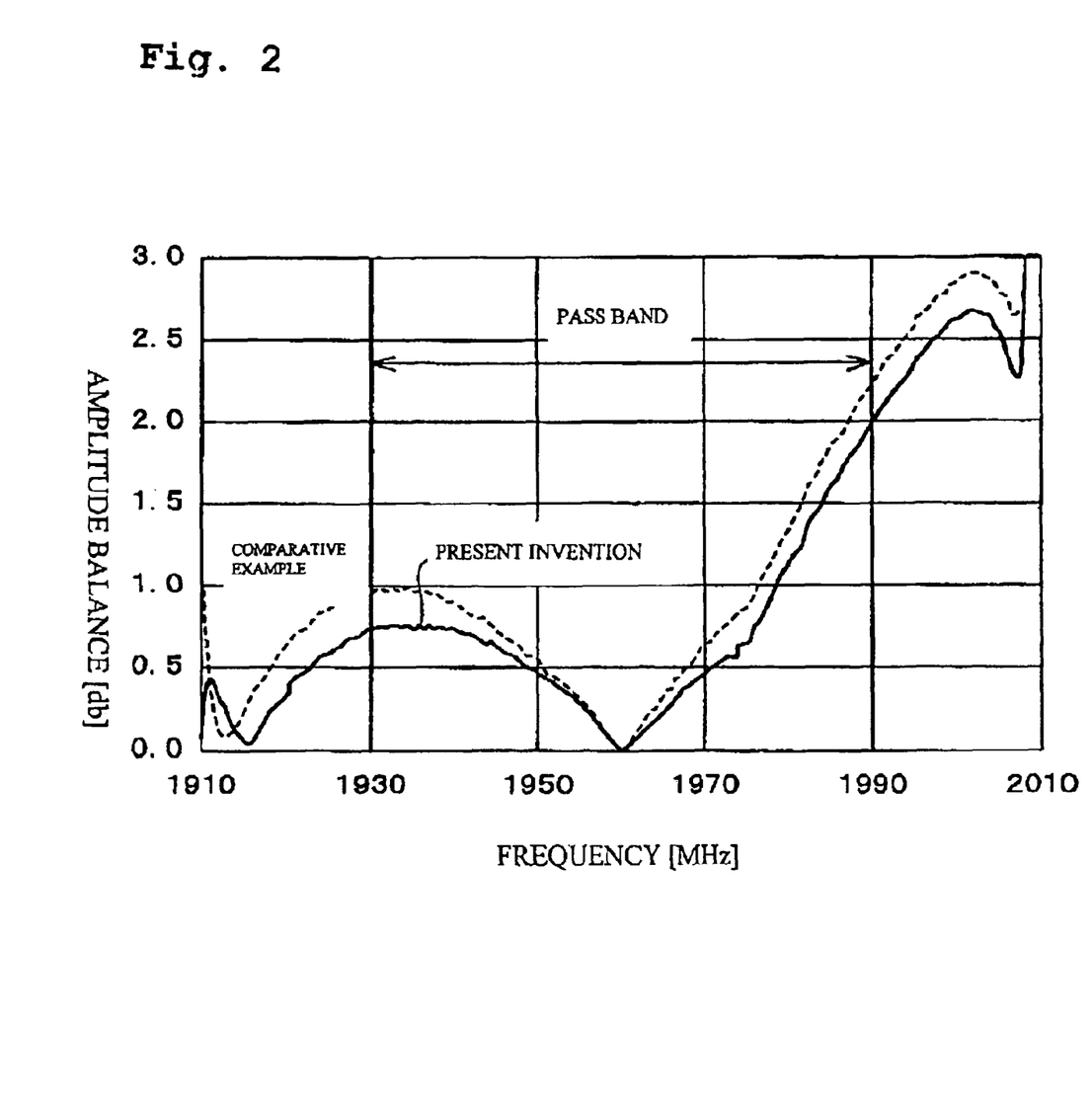
FIG. 2 is a graph showing the difference in amplitude balance between the preferred embodiment of FIG. 1 and a comparative example.
Figure 3:
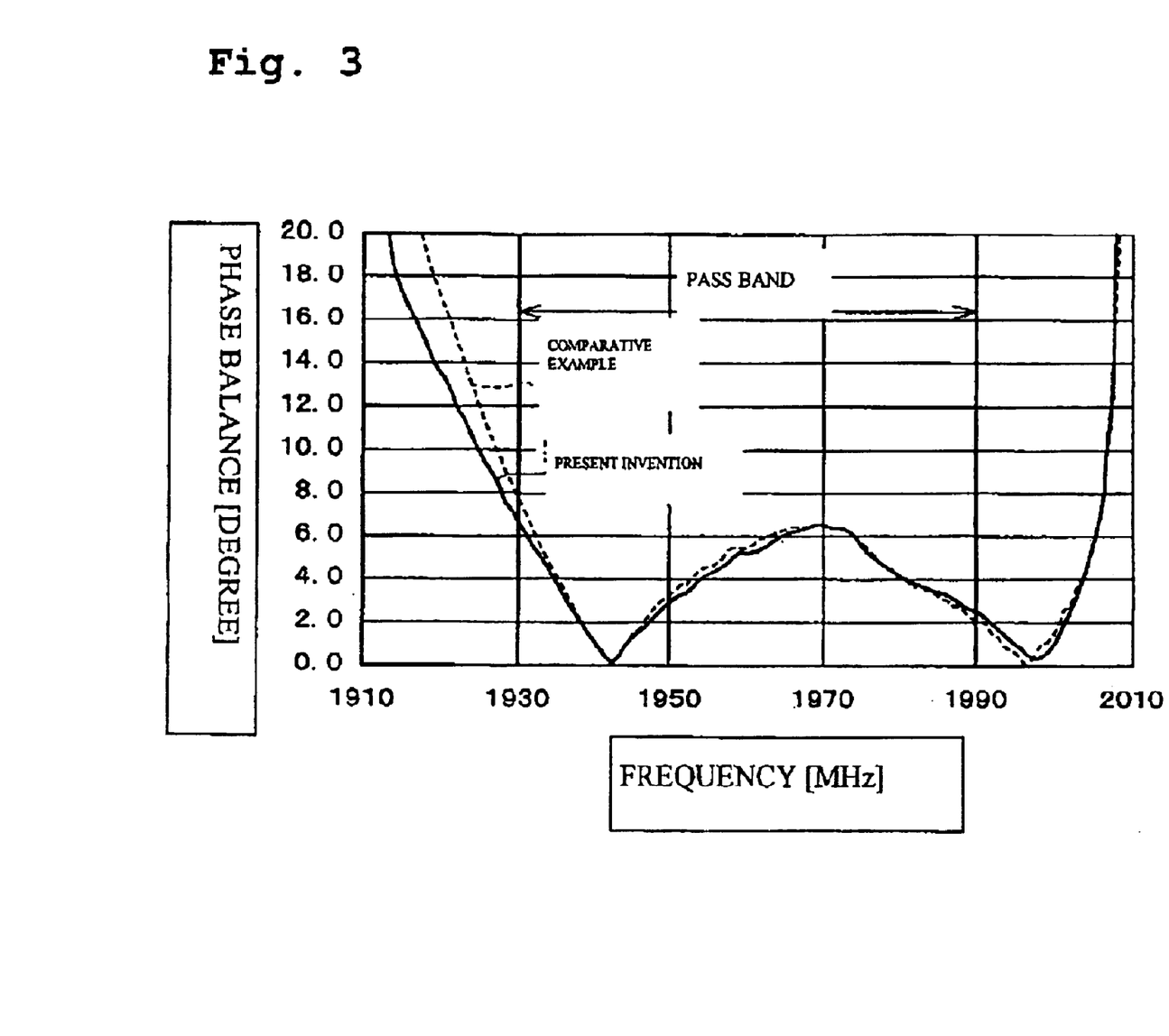
FIG. 3 is a graph showing the difference in phase balance between the preferred embodiment of FIG. 1 and the comparative example.

The operations and advantages of the SAW filter of the present preferred embodiment are now described. FIGS. 2 and 3 are graphs showing the amplitude balance and the phase balance between the balanced signal terminals 214 and 215, respectively, in the frequency characteristic of the SAW filter according to the present preferred embodiment. For comparison, the amplitude balance and the phase balance of a SAW filter as a comparative example are also shown in FIGS. 2 and 3, respectively. The SAW filter in the comparative example is the same as the SAW filter shown in FIG. 1, except that the ground terminals 216 and 218 are combined into a single ground terminal.

The frequency of the pass band of a PCS reception filter ranges from about 1930 MHz to about 1990 MHz. The maximum amplitude balance in this frequency range is 2.4 dB for the comparative example, while it is about 2.0 dB for the present preferred embodiment. In the present preferred embodiment, therefore, the amplitude balance is improved by about 0.4 dB.

The maximum phase balance in the frequency range is 8° for the comparative example, while it is about 7° for the present preferred embodiment. In the present preferred embodiment, therefore, the amplitude balance is improved by about 1°. This is caused by electrically isolating the ground terminal 216 for the IDT 206 from the ground terminal 218 for the IDT 208 on the piezoelectric substrate 201.

The advantage of improved balance between the balanced signal terminals 214 and 215 would also be achieved by electrically connecting the ground terminals 216 and 218, which are electrically isolated from each other, to the different bonding pads 223 and 225, which are electrically isolated from each other in the package 205, respectively.

For example, in FIG. 1, if both the ground terminals 216 and 218 are electrically connected to the bonding pad 223, or if the bonding pads 223 and 225 are electrically connected with each other within the package 205, it has been discovered and confirmed that balance between the balanced signal terminals 214 and 215 is lower than that in the present preferred embodiment.

According to the present preferred embodiment, therefore, the SAW filter having a balance-to-unbalance conversion function is configured so that ground terminals for the IDTs connected to the unbalanced signal input or output terminal are electrically isolated from each other on a piezoelectric substrate or within a package. Consequently, the SAW filter according to the present preferred embodiment has greatly improved balance between balanced signal terminals compared with a SAW filter in the comparative example or a SAW filter in the related art.

In the present preferred embodiment, the center IDT 207 of the three IDTs 206, 207, and 208 in the longitudinally couple resonator SAW filter unit 202 preferably has an even number of electrode fingers in total. Thus, the number of electrode fingers connected to the balanced signal terminal 214 can be equal to the number of electrode fingers connected to the balanced signal terminal 215, thereby further improving balance between the balanced signal terminals 214 and 215 in the advantages of the present invention.

As in the present preferred embodiment, preferably, the center IDT 207 has an even number of electrode fingers in total in order to further improve balance between the balanced signal terminals 214 and 215. However, an odd number of electrode fingers in total would also achieve the advantages of the present invention.

In the present preferred embodiment, the ground line 220 is inserted between the signal line 219 and the balanced signal terminal 214. Thus, the bridge capacitance can be reduced between the signal line 219 and the balanced signal terminal 214, thereby further improving balance between the balanced signal terminals 214 and 215 in the advantages of the present invention.

As in the present preferred embodiment, preferably, the ground line 220 is inserted to a portion where the signal line 219 is adjacent to the balanced signal terminal 214 in order to further improve balance between the balanced signal terminals 214 and 215. Without the ground line 220 inserted, however, the advantages of the present invention would also be achieved.

The present invention has been discussed in context of a SAW filter including two SAW resonators 203 and 204 which are connected in series to a single longitudinally coupled resonator SAW filter unit 202 having three IDTs 206, 207, and 208 so that a balanced signal is obtained from the center IDT 207 in the SAW filter unit 202. However, the present invention is not limited to this form, and the advantages of the present invention would also be achieved by a SAW filter having balanced signal terminals using any configuration.

Figure 4:
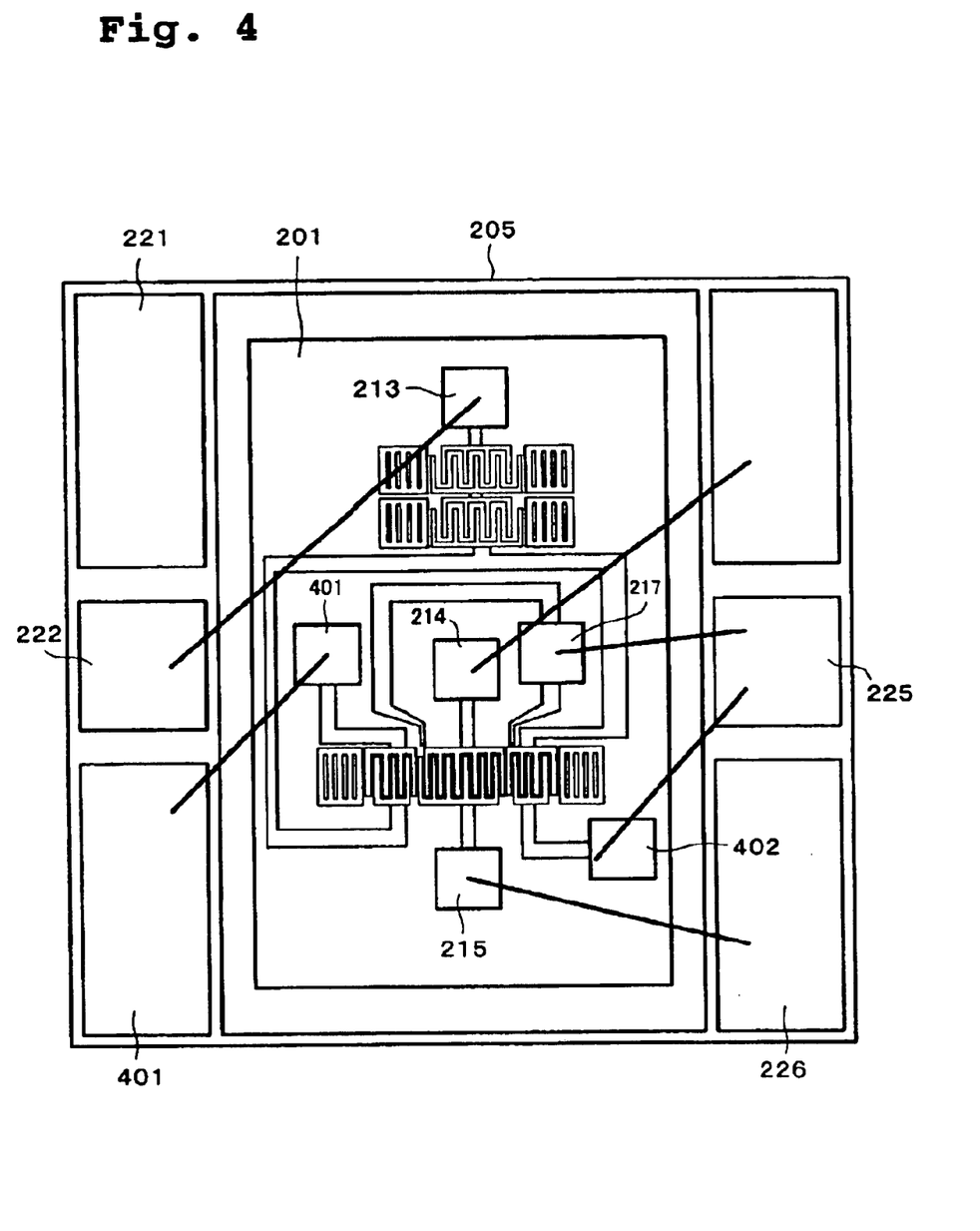
FIG. 4 is a schematic diagram of a modification of the SAW filter according to the preferred embodiment of FIG. 1.

For example, a longitudinally coupled resonator SAW filter unit having more than four IDTs or a SAW filter unit having a SAW resonator connected in parallel thereto would also achieve advantages similar to those of the preferred embodiments of the present invention. A SAW filter, as shown in FIG. 4, in which an unbalanced signal is input (output) from the opposite sides of IDTs of a longitudinally coupled resonator SAW filter unit, may be used. In this SAW filter, ground terminals 401 and 402 for the IDTs may be electrically isolated from each other on the piezoelectric substrate 201 or within the package 205, thereby achieving the advantages of the present invention.

Figure 5:
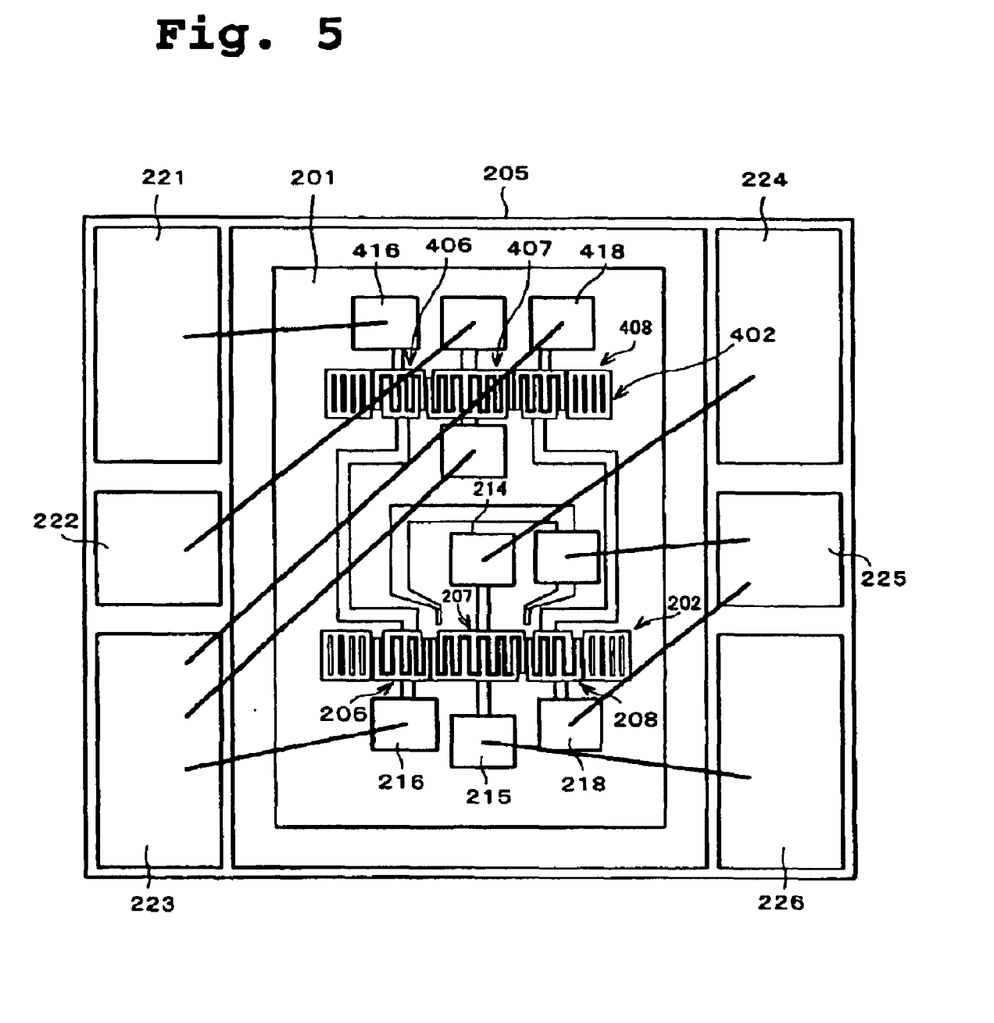
FIG. 5 is a schematic diagram of another modification of the SAW filter of the preferred embodiment of FIG. 1.

A SAW filter, as shown in FIG. 5, in which longitudinally coupled resonator SAW filter units 202 and 402 are cascade-connected, may also be used. In this SAW filter, ground terminals 216 and 218 for IDTs 206 and 208 that sandwich the center IDT 207 therebetween, and/or ground terminals 416 and 418 for IDTs 406 and 408 that sandwich the center IDT 407 therebetween may be electrically isolated from each other at least on the piezoelectric substrate 201 or within the package 205, thereby achieving the advantages of the present invention.

Besides the SAW filter in the present preferred embodiment of the floating balanced type that it does not have an electrically neutral point between the balanced signal terminals 214 and 215, a SAW filter having an electrically neutral point between the balanced signal terminals 214 and 215 would also improve balance between the balanced signal terminals 214 and 215 according to the present invention.

In the SAW filter according to a preferred embodiment of the present embodiment, the piezoelectric substrate 201 is preferably a 40±5° Y-cut X-propagating LiTaO$_3$ substrate. However, the present invention is not limited thereto as long as the advantages of the present invention are achieved. The piezoelectric substrate 201 may be made of 64° to 72° Y-cut X-propagating LiNbO$_3$, 41° Y-cut X-propagating LiNbO$_3$, or other suitable materials.

Figure 6:
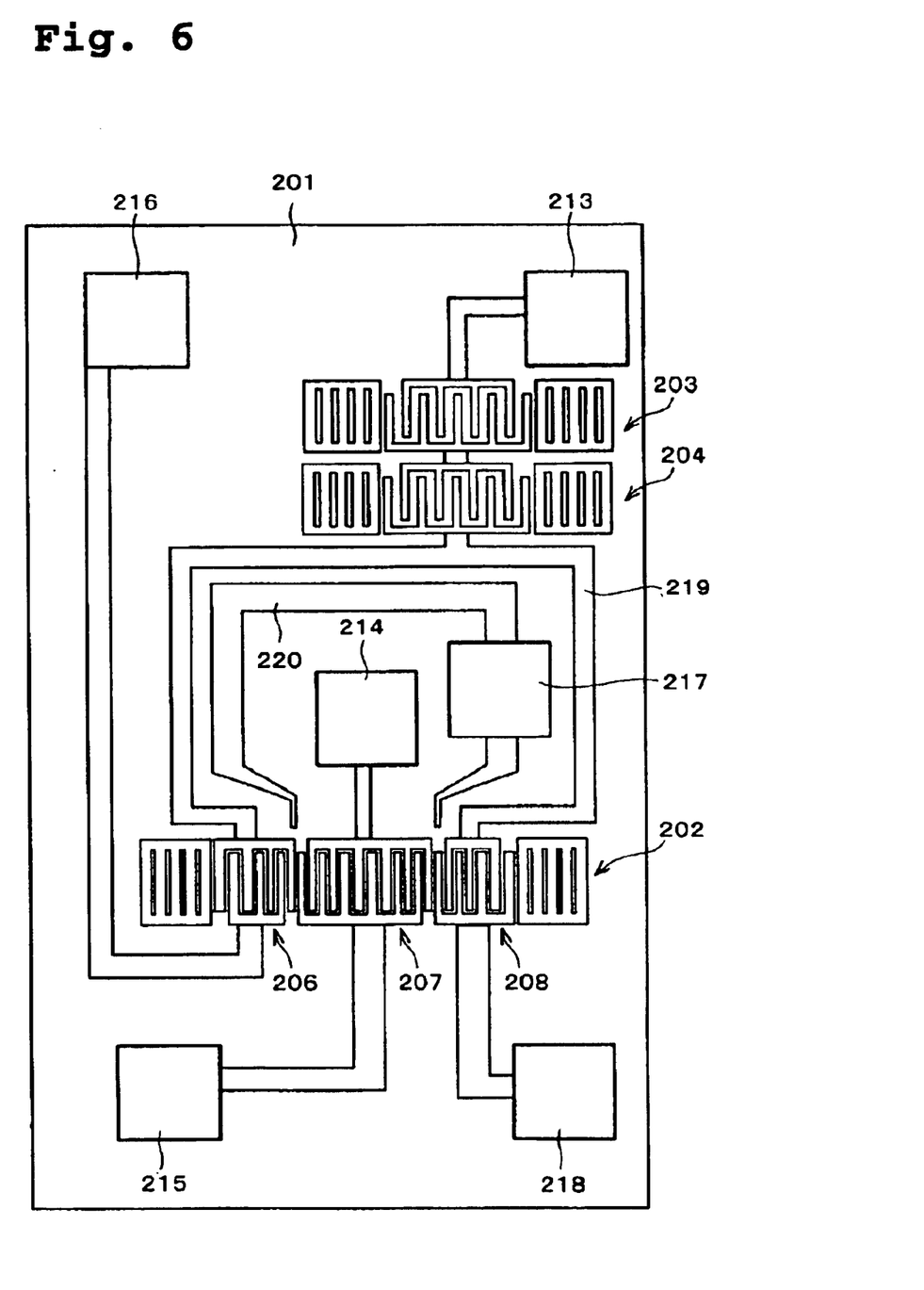
FIG. 6 is a schematic diagram of still another modification of the SAW filter of the preferred embodiment of FIG. 1, which is produced using a face-down bonding method.

A SAW filter received in a package by a face-down bonding method is now described with reference to FIGS. 6 to 9. FIG. 6 shows the layout of components formed on the piezoelectric substrate 201 shown in FIG. 1, such as electrodes and terminals, which is modified so that these components are introduced into a package 630 using a face-down bonding method. The longitudinally coupled resonator SAW filter unit 202 and the SAW resonators 203 and 204 have the same design as that described above with reference to FIG. 1.

The location of the terminals is modified so that they may be received in the package 630, although the ground terminal 216 for the IDT 206 is electrically isolated from the terminal 218 for the IDT 208 in the same way as in FIG. 1. A description of the package 630 is now given with reference to FIG. 7.

Figure 7:
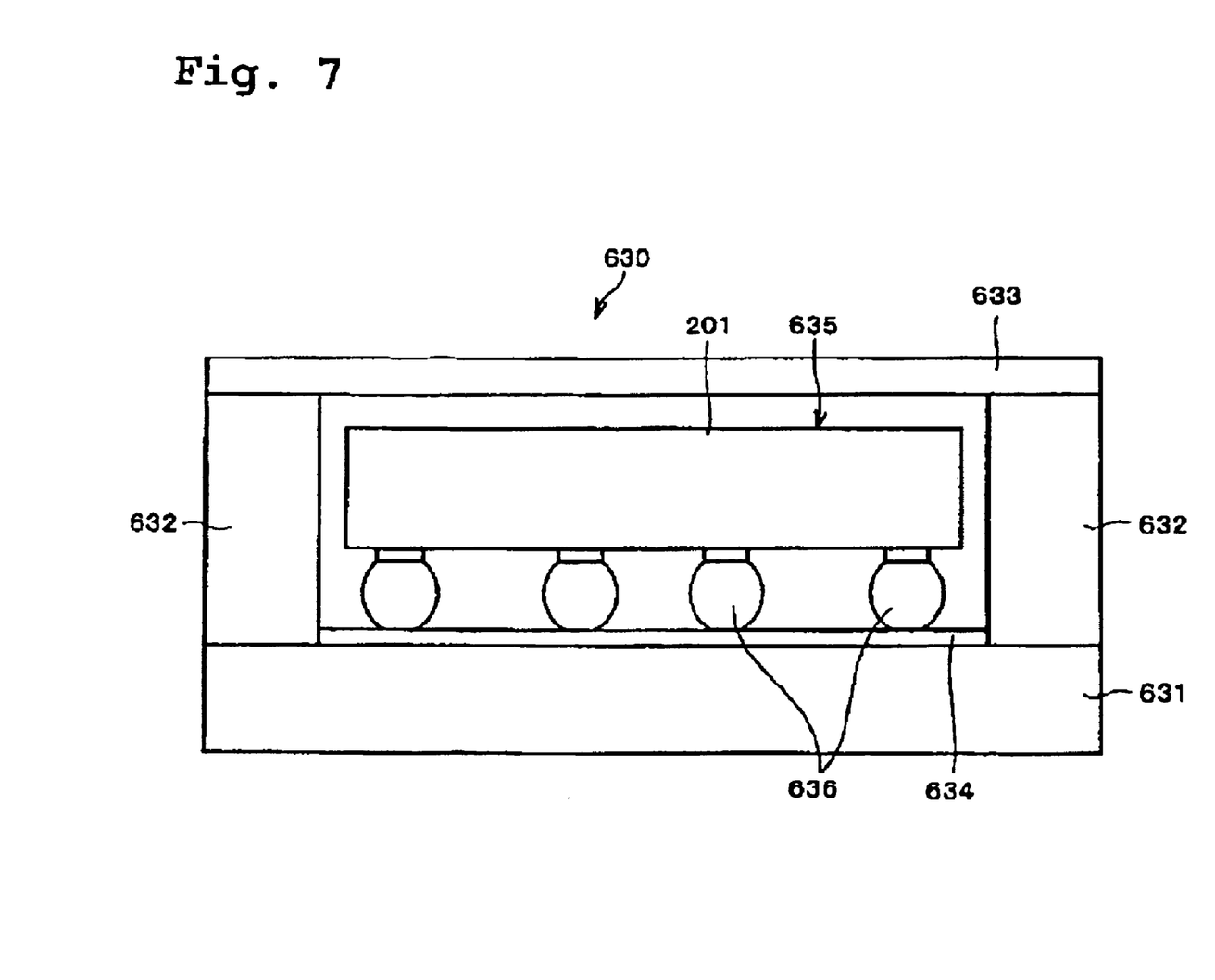
FIG. 7 is a schematic diagram of a package used in the face-down bonding method.

The package 630 is a two-layer box having a bottom plate 631, side walls 632, and a cap 633. A die attach 634 is formed on the inner surface of the bottom plate 631, so that the die attach 634 can be electrically connected to a SAW filter 635 formed on a surface of the piezoelectric substrate 201 that faces the inner surface. The SAW filter 635 and the die attach 634 are electrically and mechanically coupled with each other by bumps 636.

Figure 8:
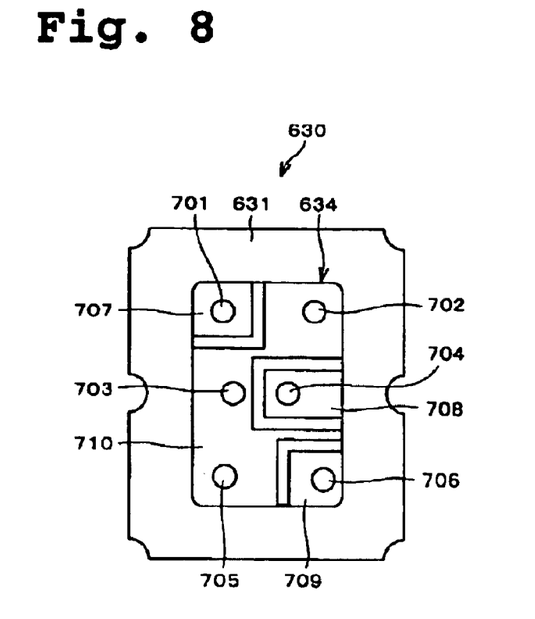
FIG. 8 is a plan view of a die attach in the package.

FIG. 8 is a top plan view of the die attach 634 shown in FIG. 7, as viewed from the SAW filter 635 side. The die attach 634 has terminals 707 to 710 formed thereon. The terminal 707 is specific to an unbalanced signal terminal, the terminals 708 and 709 are specific to balanced signal terminals, and the terminal 710 is specific to ground terminals. In FIG. 8, the bump locations are indicated by white circles 701 to 706. The unbalanced signal terminal 213 shown in FIG. 6 is electrically connected to the die attach 634 of the package 630 via the bump 701. The balanced signal terminals 214 and 215 are electrically connected to the die attach 634 via the bumps 704 and 706, respectively. The ground terminals 216, 217, and 218 are electrically connected to the die attach 634 via the bumps 702, 703, and 705, respectively.

In the SAW filter produced by a face-down bonding method, therefore, the ground terminal 216 for the IDT 206 is electrically isolated from the ground terminal 218 for the IDT 208 within the package 630 of the chip type. The SAW filter can therefore have high balance between the balanced signal terminals 214 and 215.

A ground terminal is divided into a plurality of sections, for example, two sections, such as the ground terminals 216 and 218, and the bumps are positioned at the four corners of the piezoelectric substrate 201, as shown in FIG. 6, thus allowing the positions for bump bonding to be highly balanced. Because of the highly balanced positions for bump bonding, therefore, the bonding strength between the package 630 and the piezoelectric substrate 201 shown in FIG. 7 can be increased.

Figure 9:
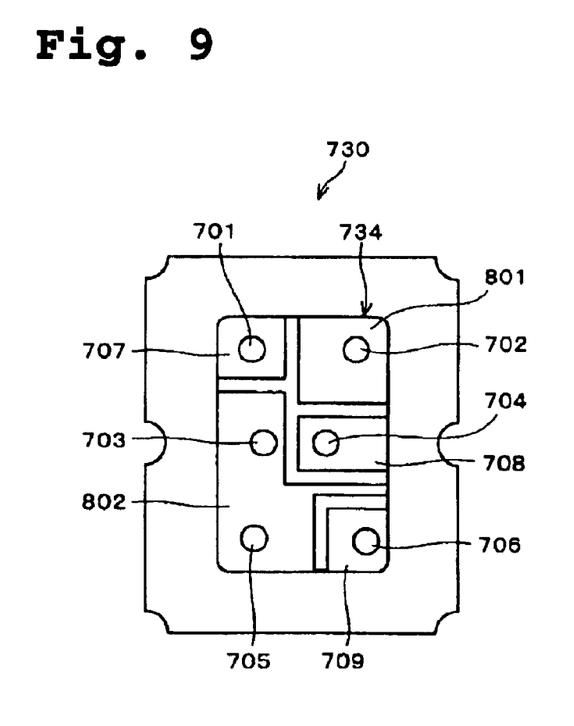
FIG. 9 is a plan view of a modification of the die attach.

As an alternative, as shown in FIG. 9, a package 730 having a die attach 734 in which the ground-terminal-specific terminal 710 shown in FIG. 8 is divided into two sections, i.e., ground-terminal-specific terminals 801 and 802, may also be available. In this case, the ground terminal 216 for the IDT 206 can be electrically isolated from the ground terminal 218 for the IDT 208, again, in the package 730, thereby further improving balance between the balanced signal terminals 214 and 215.

According to preferred embodiments of the present invention, therefore, in a SAW filter having, on a piezoelectric substrate, a plurality of IDTs arranged along the SAW propagation direction, and balanced signal input or output terminals, ground terminals for the IDTs connected to an unbalanced signal input or output terminal of the SAW filter are electrically isolated from each other on the piezoelectric substrate. Thus, balance can be improved between the balanced signal terminals.

The ground terminals electrically isolated from each other on the piezoelectric substrate are electrically connected to different terminals (bonding pads) of a package, thus allowing the ground terminals to be electrically isolated from each other within the package. Thus, balance can also be improved between the balanced signal terminals.

The IDT connected to the balanced signal input or output terminals preferably has an even number of electrode fingers in total, and a ground line is inserted between a signal line and a signal terminal which are adjacent to each other in the SAW filter so as to reduce the bridge capacitance between the signal line and the signal terminal. Thus, balance can also be improved between the balanced signal terminals.

Preferably, at least one SAW resonator is connected in series or in parallel or in combination thereof to the SAW filter unit in order to increase the out-of-passband attenuation.

Figure 10:
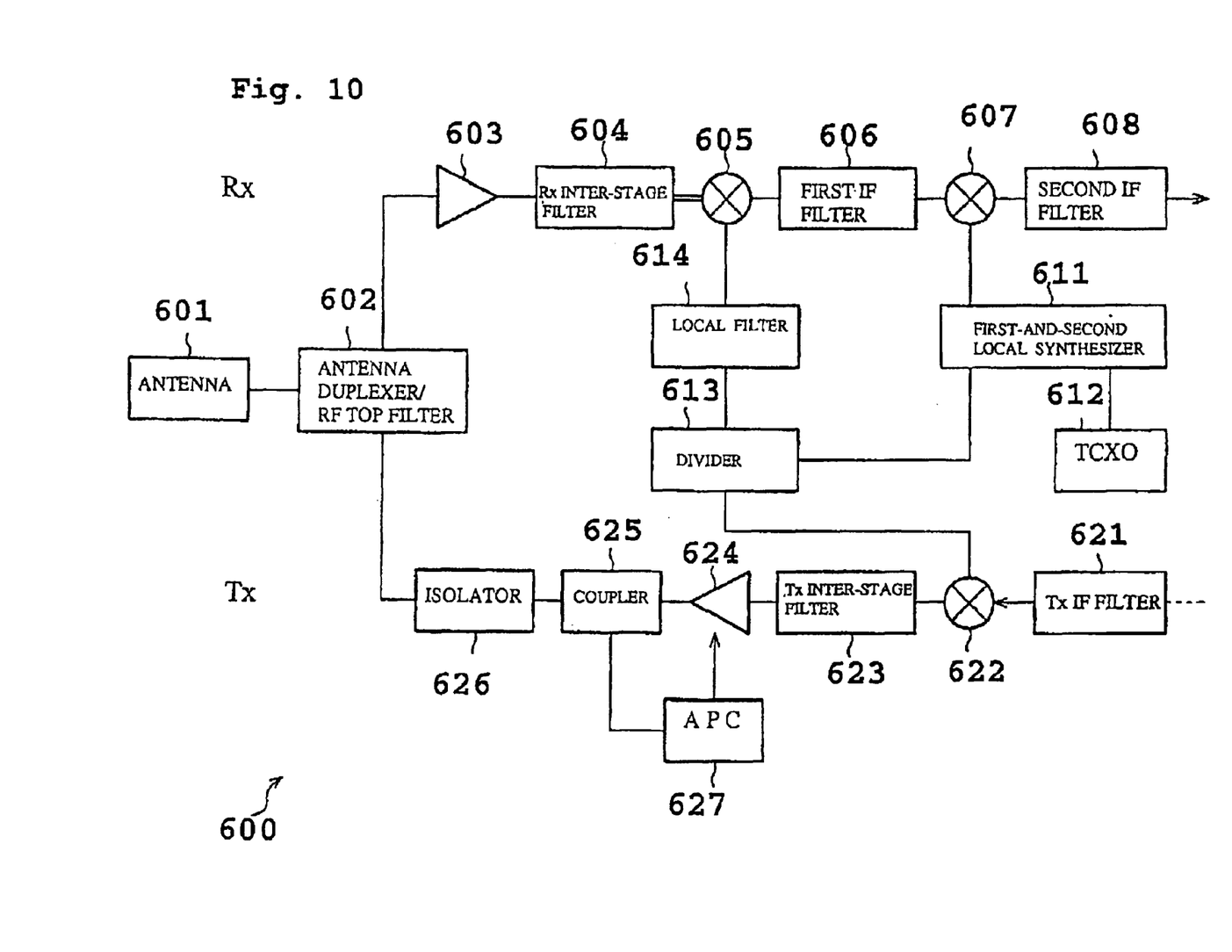
FIG. 10 is a block diagram of a main portion of a communication apparatus according to another preferred embodiment of the present invention.

A description is now given, with reference to FIG. 10, of a communication apparatus 600 using a SAW filter according to another preferred embodiment of the present embodiment. In the communication apparatus 600, a receiver (Rx) for reception includes an antenna 601, an antenna duplexer/RF top filter 602, an amplifier 603, Rx inter-stage filter 604, a mixer 605, a first IF filter 606, a mixer 607, a second IF filter 608, a first-and-second local synthesizer 611, a temperature compensated crystal oscillator (TCXO) 612, a divider 613, and a local filter 614.

Preferably, two balanced signals are transmitted from the Rx inter-stage filter 604 to the mixer 605, as indicated by two lines in FIG. 10, in order to maintain balance.

In the communication apparatus 600, a transmitter (Tx) for transmission includes the antenna 601, the antenna duplexer/RF top filter 602, a Tx IF filter 621, a mixer 622, a Tx inter-stage filter 623, an amplifier 624, a coupler 625, an isolator 626, and an automatic power control (APC) 627. The antenna 601 and the antenna duplexer/RF top filter 602 are shared by the receiver and the transmitter.

The SAW filter according to preferred embodiments described above may be suitably used as the Rx inter-stage filter 604, the first IF filter 606, the Tx IF filter 621, and the Tx inter-stage filter 623.

The SAW filter according to preferred embodiments of the present invention has both a filtering function and a balance-to-unbalance conversion function, and exhibits a satisfactory characteristic, i.e., an ideal phase characteristic between balanced signals. Therefore, a communication apparatus according to another preferred embodiment of the present invention, which uses such a novel SAW filter, has a higher transmission characteristic.

While preferred embodiments of the invention have been described above, it is to be understood that variations and modifications will be apparent to those skilled in the art without departing the scope and spirit of the invention. The scope of the invention, therefore, is to be determined solely by the following claims.

What is claimed is:

1. A surface acoustic wave filter comprising:
   a piezoelectric substrate;
   a filter unit provided on the piezoelectric substrate, said filter unit having an odd number of at least three interdigital transducers arranged along a surface acoustic wave propagation direction, each of the at least three interdigital transducers having a pair of electrode finger sets;
   balanced signal terminals being connected to the pair of electrode finger sets of the center interdigital transducer of the at least three interdigital transducers; and an unbalanced signal terminal connected to one electrode finger set of each of at least two end interdigital transducers of the at least three interdigital transducers, said at least two end interdigital transducers being different from the center interdigital transducer, and being located on ends of the filter unit;

the other electrode finger set of each of said at least two end interdigital transducers being connected to a ground; wherein the ground for at least one of the at least two end interdigital transducers is electrically isolated on the piezoelectric substrate from the ground for the other of the at least two end interdigital transducers.

2. A surface acoustic wave filter according to claim 1, wherein a signal line for connecting the unbalanced signal terminal to the at least two end interdigital transducers is arranged so as to surround one of the balanced signal terminals, and a ground line is provided between the signal line and the balanced signal terminal surrounded by the signal line.

3. A surface acoustic wave filter according to claim 2, wherein a ground line is inserted between one of the balanced signal terminals and the signal line.

4. A surface acoustic wave filter according to claim 1, further comprising reflectors disposed on the piezoelectric substrate next to the at least two end interdigital transducers.

5. A surface acoustic wave filter according to claim 1, further comprising a package which receives the piezoelectric substrate, the package including a plurality of separate bonding pads for ground terminals, and the grounds for the end interdigital transducers that sandwich the center interdigital transducer therebetween are connected to the different bonding pads so as to be electrically isolated from each other.

6. A surface acoustic wave filter according to claim 1, wherein the interdigital transducer connected to the balanced signal terminals has an even number of electrode fingers in total.

7. A surface acoustic wave filter according to claim 1, wherein at least one surface acoustic wave resonator is connected in at least one of series and parallel to the filter unit.

8. A surface acoustic wave filter according to claim 1, wherein the surface acoustic wave filter has a balance-to-unbalance conversion function.

9. A surface acoustic wave filter according to claim 1, wherein the filter unit is a surface acoustic wave filter unit.

10. A surface acoustic wave filter according to claim 1, further comprising a plurality of surface acoustic wave filter units disposed on the piezoelectric substrate and cascade connected.

11. A communication apparatus comprising the surface acoustic wave filter according to claim 1.

12. A surface acoustic wave filter comprising:

a piezoelectric substrate;

a plurality of filter units provided on the piezoelectric substrate, each filter unit having an odd number of at least three interdigital transducers arranged along a surface acoustic wave propagation direction, each of the at least three interdigital transducers having a pair of electrode finger sets;

balanced signal terminals being connected to a pair of electrode finger sets of a first center interdigital transducer which is located at the approximate center of a first filter unit of the plurality of filter units; and an unbalanced signal terminal connected to one electrode finger set of a second center interdigital transducer which is located at the approximate center of a second filter unit that is different from the first filter unit of the plurality of filter units;

one electrode finger set of each of end interdigital transducers that are different from the first and second center interdigital transducers of the plurality of filter units being connected to a ground, said end interdigital transducers being located on ends of the first and second filter units; wherein the ground for at least one of the end interdigital transducers is electrically isolated on the piezoelectric substrate from the ground for the other end interdigital transducer.

13. A surface acoustic wave filter according to claim 12, wherein the plurality of filter units are surface acoustic wave filter units and are cascade connected.

14. A surface acoustic wave filter according to claim 12, wherein a signal line for connecting the unbalanced signal terminal to the end interdigital transducers is arranged so as to surround one of the balanced signal terminals, and a ground line is provided between the signal line and the balanced signal terminal surrounded by the signal line.

15. A surface acoustic wave filter according to claim 12, further comprising reflectors disposed on the piezoelectric substrate next to the end interdigital transducers.

16. A surface acoustic wave filter according to claim 12, further comprising a package which receives the piezoelectric substrate, the package including a plurality of separate bonding pads for ground terminals, and the grounds for the end interdigital transducers that sandwich the center interdigital transducer therebetween are connected to the different bonding pads so as to be electrically isolated from each other.

17. A surface acoustic wave filter according to claim 12, wherein the interdigital transducer connected to the balanced signal terminals has an even number of electrode fingers in total.

18. A surface acoustic wave filter according to claim 12, wherein at least one surface acoustic wave resonator is connected in at least one of series and parallel to the plurality of filter units.

19. A surface acoustic wave filter according to claim 12, wherein the surface acoustic wave filter has a balance-to-unbalance conversion function.

20. A communication apparatus comprising the surface acoustic wave filter according to claim 12.

* * * * *